(12) United States Patent
Yang et al.

(10) Patent No.: US 12,362,211 B2
(45) Date of Patent: Jul. 15, 2025

(54) DETECTING DEFECTS OF SEMICONDUCTOR MANUFACTURING ASSEMBLIES

(71) Applicant: Applied Materials, Inc., Santa Clara, CA (US)

(72) Inventors: Yao-Hung Yang, Santa Clara, CA (US); Chih-Yang Chang, Santa Clara, CA (US); Shannon Wang, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 338 days.

(21) Appl. No.: 17/987,356

(22) Filed: Nov. 15, 2022

(65) Prior Publication Data

US 2024/0162065 A1 May 16, 2024

(51) Int. Cl.
*H01L 21/67* (2006.01)
*G01M 5/00* (2006.01)
*G05B 19/418* (2006.01)

(52) U.S. Cl.
CPC ..... *H01L 21/67276* (2013.01); *G01M 5/0066* (2013.01); *G05B 19/41875* (2013.01); *G05B 2219/32368* (2013.01)

(58) Field of Classification Search
CPC .... G01N 22/46; G01M 5/0066; G01M 7/022; G01M 7/025; G05B 19/41875; G05B 2219/32368; G05B 11/00; G05B 13/00; G05B 15/00; G05B 19/00; G05B 23/00; H01L 21/67253; H01L 21/67276; H01L 21/67288; H01L 22/00; H01L 21/00; H01L 25/00
See application file for complete search history.

(56) References Cited

U.S. PATENT DOCUMENTS

| 7,882,394 | B2 | 2/2011 | Hosek et al. |
| 10,674,297 | B2 | 6/2020 | Smith et al. |
| 11,069,952 | B2 | 7/2021 | Keller, III |
| 2002/0153102 | A1 | 10/2002 | Bernard et al. |

(Continued)

OTHER PUBLICATIONS

Miao et al., New Method ofDenoising ofVibration Signal and Its Application, May 2020, Hindewi, p. 1-8 (Year: 2020).*

(Continued)

*Primary Examiner* — Kidest Bahta
(74) *Attorney, Agent, or Firm* — Moser Taboada

(57) ABSTRACT

A method of determining an operational status of a semiconductor manufacturing assembly uses internal vibrations of an in-situ assembly to detect defects. The method may include initiating a first test vibration in an internal structure of the semiconductor manufacturing assembly while the semiconductor manufacturing assembly is in-situ in a semiconductor processing chamber, receiving a first vibration signal caused by the first test vibration, transforming the first vibration signal into a first frequency domain representation of the first vibration signal, determining the operational status of the semiconductor manufacturing assembly based on the first frequency domain representation, and performing a corrective action for the semiconductor manufacturing assembly in response to the operational status.

20 Claims, 6 Drawing Sheets

(56) References Cited

U.S. PATENT DOCUMENTS

| | | | |
|---|---|---|---|
| 2002/0169569 A1* | 11/2002 | Miller | G01H 1/003 |
| | | | 702/56 |
| 2004/0064277 A1 | 4/2004 | Samata et al. | |
| 2007/0067117 A1* | 3/2007 | Lim | H01L 21/67115 |
| | | | 702/56 |
| 2007/0224712 A1 | 9/2007 | Kaushal et al. | |
| 2010/0129940 A1* | 5/2010 | Little | G01H 11/06 |
| | | | 73/649 |
| 2012/0204646 A1* | 8/2012 | Lee | G01M 7/00 |
| | | | 73/594 |
| 2015/0135862 A1 | 5/2015 | Yap et al. | |

OTHER PUBLICATIONS

PCT International Search Report and Written Opinion for PCT/US2023/037050 dated Mar. 5, 2024.

* cited by examiner

DETECTING DEFECTS OF SEMICONDUCTOR MANUFACTURING ASSEMBLIES

FIELD

Embodiments of the present principles generally relate to semiconductor processing of semiconductor substrates.

BACKGROUND

During semiconductor manufacturing, some components have an expected lifetime that may be affected by exposure to hostile environments in a process chamber. For critical components, a failure may cause a shutdown of the manufacturing line at best and may also cause failure of other components. If a component has an expected lifetime of 600 hours and catastrophically fails at 500 hours, manufacturers will err on the side of caution and begin replacing the component at 450 hours whether replacement is warranted or not. Although following such a replacement policy may guarantee that the manufacturing line remains functional, components may be replaced well before the component's actual lifetime is obtained, increasing operational costs. The inventors have observed that 20% to 30% of the actual useful lifetime of a component may remain unused by using such a replacement policy.

Accordingly, the inventors have provided methods for accurately determining the health of a process chamber assembly to allow for maximum use of the assembly's actual lifetime, dramatically reducing manufacturing costs while avoiding catastrophic failures.

SUMMARY

Methods for determining the health of semiconductor process chamber assemblies are provided herein.

In some embodiments, a method of determining an operational status of a semiconductor manufacturing assembly may comprise initiating a first test vibration in an internal structure of the semiconductor manufacturing assembly while the semiconductor manufacturing assembly is in-situ in a semiconductor processing chamber, receiving a first vibration signal caused by the first test vibration, transforming the first vibration signal into a first frequency domain representation of the first vibration signal, determining the operational status of the semiconductor manufacturing assembly based on the first frequency domain representation, and performing a corrective action for the semiconductor manufacturing assembly in response to the operational status.

In some embodiments, a method of determining an operational status of a semiconductor manufacturing assembly may comprise detecting a background vibration signal while the semiconductor manufacturing assembly is in-situ in a semiconductor processing chamber, initiating a first test vibration in an internal structure of the semiconductor manufacturing assembly, receiving a first vibration signal caused by the first test vibration, removing the background vibration signal from the first vibration signal to obtain a first filtered vibration signal, transforming the first filtered vibration signal to obtain a first frequency domain representation of the first filtered vibration signal, initiating a second test vibration at an interval after the first test vibration in the internal structure of the semiconductor manufacturing assembly while the semiconductor manufacturing assembly is in-situ in the semiconductor processing chamber, receiving a second vibration signal caused by the second test vibration, removing the background vibration signal from the second vibration signal to obtain a second filtered vibration signal, transforming the second filtered vibration signal to obtain a second frequency domain representation of the second vibration signal, comparing a first set of peaks of the first frequency domain representation of the first filtered vibration signal to a second set of peaks of the second frequency domain representation of the second filtered vibration signal obtained from the semiconductor manufacturing assembly to determine the operational status of the semiconductor manufacturing assembly, wherein comparing includes comparing peak location, peak magnitude, and peak width of the first set of peaks and the second set of peaks, and performing a corrective action for the semiconductor manufacturing assembly in response to the operational status.

In some embodiments, a non-transitory, computer readable medium having instructions stored thereon that, when executed, cause a method of determining an operational status of a semiconductor manufacturing assembly to be performed, the method may comprise initiating a first test vibration in an internal structure of the semiconductor manufacturing assembly while the semiconductor manufacturing assembly is in-situ in a semiconductor processing chamber, receiving a first vibration signal caused by the first test vibration, transforming the first vibration signal into a first frequency domain representation of the first vibration signal, determining the operational status of the semiconductor manufacturing assembly based on the first frequency domain representation, and performing a corrective action for the semiconductor manufacturing assembly in response to the operational status.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
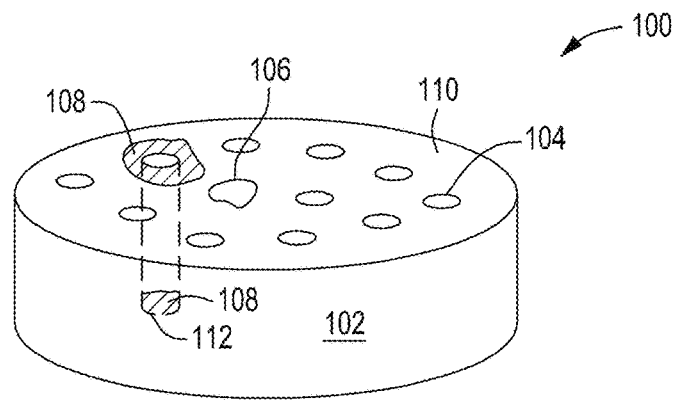
FIG. 1 depicts an isometric view of a semiconductor process chamber assembly with defects that affect the assembly's useful working life expectancy in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods leverage vibration data obtained from an in-situ assembly of a semiconductor process chamber to determine the operational status (health and life expectancy) of the assembly. Accelerometry devices attached to the assembly along with fast Fourier transfer (FFT) processing of test vibration data yields an intelligent method to detect internal defects of critical assemblies without removal or destructive testing of the assembly. The methods of the present principles have the advantage of real time monitoring of the assembly's health status that provides more a precise failure timeline to prevent too early or too late replacement of the assembly.

Currently, parts and components fail early without any signal to give the semiconductor manufacturer time to react. The lack of an accurate health status causes manufacturers to replace early to avoid catastrophic failures. However, replacing an assembly before the assembly is bad, wastes the manufacturer's money and increases production costs. By providing a real time monitoring capability for a critical component's lifetime, accurate assessment of the health of the component can be established by comparing metrology data during the lifetime of the component to determine when the component should be replaced, rather than by time or production run number to trigger preventative maintenance replacements. In the methods of the present principles, at least one accelerometer is attached to the assembly while the assembly is in-situ in the semiconductor process chamber. A vibration pulse is generated within the assembly by an impulse hammer and/or by a vibration generator attached to the assembly.

The vibration signal data is collected by the accelerometer and transferred via wired and/or wireless communications to a vibration analyzer. The vibration analyzer performs a FFT on the raw vibration data from the accelerometer. The vibration analyzer then compares the peaks in the frequency spectrum between vibration data samples from clean, new assemblies and vibration data samples from aging, dirty assemblies. The comparison data can then be used to provide notification of the remaining life expectancy of the in-situ assembly. The overall process is a fast, efficient, and non-destructive process to determine the internal health of an in-situ assembly. In some embodiments, the comparison data may be used in a controller of a semiconductor manufacturing line to adjust parameters or even to halt/adjust the production line if an assembly failure is eminent.

In a view 100, a lamp assembly 102 is used as an example process chamber assembly that can be monitored using the methods of the present principles and is not meant to be limiting to only lamp assemblies. In the example, the lamp assembly 102 is shown ex-situ for illustration of the attachment of the accelerometers 204 and the vibration generator 202. The lamp assembly 102 has lamp recesses 104 that form a pattern across one surface of the lamp assembly 102. When the lamp assembly 102 is exposed to chemical vapors in the processing environment of a process chamber, defects may occur such as deformation 106 of the lamp recesses 104 or oxidation 108 on a surface 110 and/or internally 112 caused by reactions to the processing environment. For example, the present methods can determine internal oxide growth of approximately 1.0 mm in thickness and below. To facilitate in detecting such surface defects and/or internal defects, in some embodiments, a plurality of accelerometers 204 are affixed symmetrically to a surface 208 of the lamp assembly 102 as depicted in a view 200 of FIG. 2. In some embodiments, a wax can be used to attach the accelerometers. Material used for the attachment of the accelerometers should have negligible effect on the reception by the accelerometers of any test vibration pulses propagating through an assembly being tested. In some embodiments, a vibration generator 202 is also affixed to the surface 208 to generate a vibration pulse into the lamp assembly 102 that is then received by the accelerometers 204.

Figure 7:
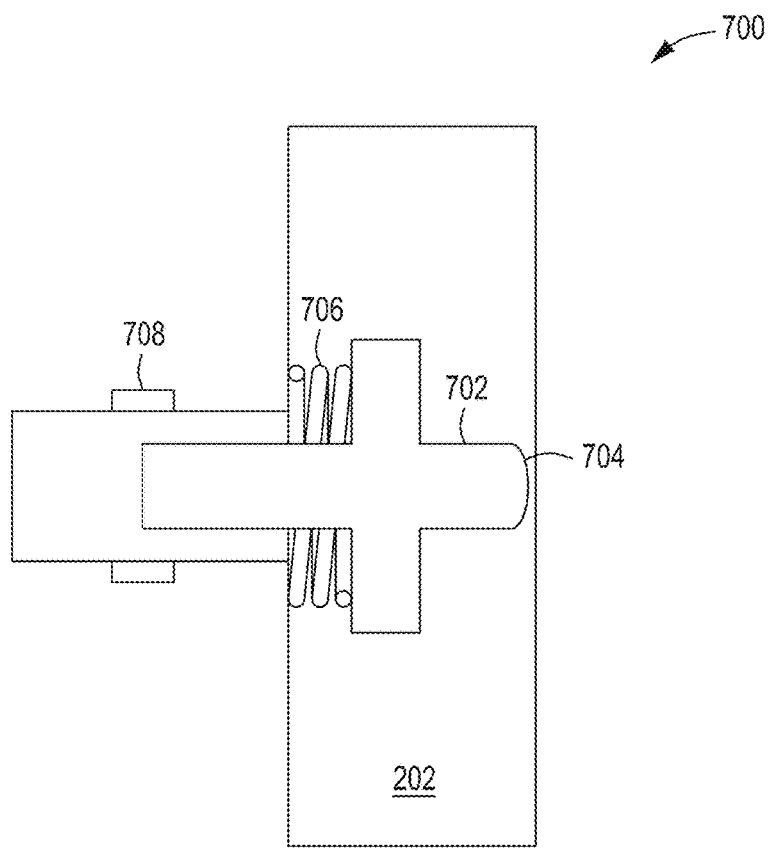
FIG. 7 depicts cross-sectional view of a vibration generator in accordance with some embodiments of the present principles.

In some embodiments, the vibration generator 202 may use a plunger 702 with a striking surface 704 as depicted in a view 700 of FIG. 7. The plunger 702 may be pulled away from an assembly which is to be struck by a solenoid 708 that causes a spring 706 to be compressed. When power to the solenoid 708 is removed, the spring tension is released causing the plunger 702 to strike an assembly with the striking surface 704 and then retract, sending a single vibration pulse through the assembly with a single strike. One skilled in the art will understand that other types of vibration generators using various internal mechanisms may be used and that the example given in FIG. 7 is not meant to be limiting. A vibration analyzer 206 may be in communication with the accelerometers 204 and/or the vibration generator 202 either in a wired or a wireless fashion. The vibration generator 202 causes a single vibration pulse 210 to travel through the lamp assembly 102 to the accelerometers 204. In some embodiments, the accelerometers 204, rather than placed symmetrically around the assembly, may be positioned near common failure locations to enable enhanced data gathering at the failure points. In some embodiments, 2 to 6 accelerometers may be used. In some embodiments, 3 to 4 accelerometers may be used. In some embodiments, the vibration generator 202 may be commanded to produce multiple vibration pulses. The vibration analyzer 206 receives the vibration data from the accelerometers 204 and, in some embodiments, may average the data for the multiple vibration pulses before performing FFT processing to produce single-sided frequency graph for comparison to graphs of an assembly without defects.

Figure 2:
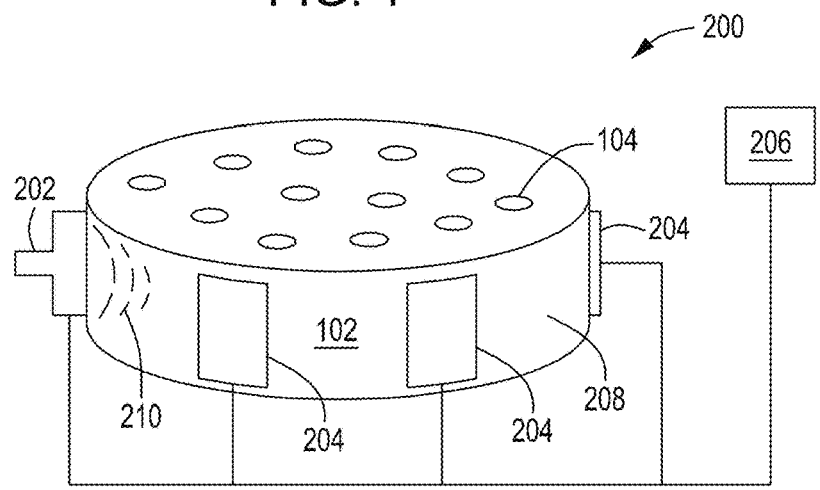
FIG. 2 depicts an isometric view of a defect metrology system for a semiconductor process chamber assembly in accordance with some embodiments of the present principles.
Figure 3:
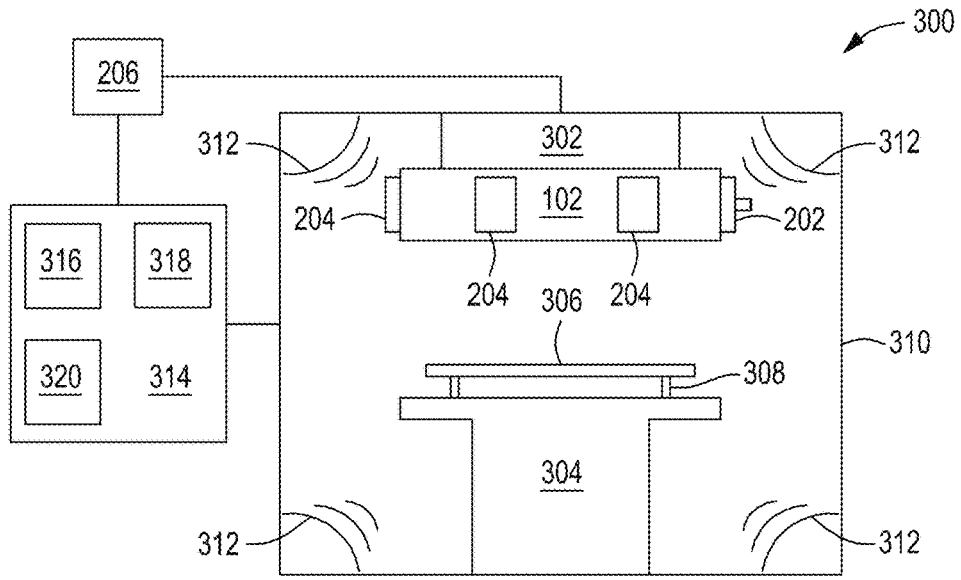
FIG. 3 depicts cross-sectional view of a defect metrology system in-situ on a semiconductor process chamber assembly in accordance with some embodiments of the present principles.

In a view 300 of FIG. 3, the lamp assembly 102 is placed in-situ inside of a process chamber 310 in an inverted orientation from that of the view 200 of FIG. 2. For the example, and not meant to be limiting, the lamp assembly 102 is placed in an annealing chamber with a pedestal 304 with substrate lifting pins 308 that elevate a substrate 306 to allow heating of both sides of the substrate 306. When the lamp assembly 102 is mounted to an overhead standoff 302 in the process chamber 310, the lamp assembly 102 will be subject to in-situ background vibrations 312 caused by the process chamber 310 and the process chamber's external environment. To account for the in-situ background vibrations 312, readings will be obtained from the accelerometers 204 by the vibration analyzer 206 without initiating any vibration pulses from the vibration generator 202. The in-situ background vibration data will then be subtracted from vibration data obtained during a vibration test such as when a vibration pulse is commanded by the vibration analyzer 206 or system controller to the vibration generator 202.

In some embodiments, the vibration analyzer 206 may be in communication with a system controller 314 that interfaces with the process chamber 310. The system controller 314 generally includes a Central Processing Unit (CPU) 316, a memory 318, and a support circuit 320. The CPU 316 may be any form of a general-purpose computer processor that can be used in an industrial setting. The support circuit 320 is conventionally coupled to the CPU 316 and may comprise a cache, clock circuits, input/output subsystems, power supplies, and the like. Software routines, such as a method as described herein may be stored in the memory 318 and, when executed by the CPU 316, transform the CPU 316 into a specific purpose computer (system controller 314). The software routines may also be stored and/or executed by a second controller (not shown) that is located remotely.

The communication between the vibration analyzer 206 and the system controller 314 allows the system controller 314 to receive health or operational status data and/or status notifications regarding the lamp assembly 102 from the vibration analyzer 206. The vibration analyzer 206 may determine a 'go' or 'no go' status or a number of runtime hours before replacement is required and the like which is sent to the system controller 314. The system controller 314 can cause the process chamber 310 to halt processing based on the status or remaining runtime hours and the like. The system controller 314 may also use the remaining runtime hours to alter the chamber processing such as using a different recipe or profile based on the information from the vibration analyzer 206 to prolong the life of the lamp assembly 102.

Figure 4:
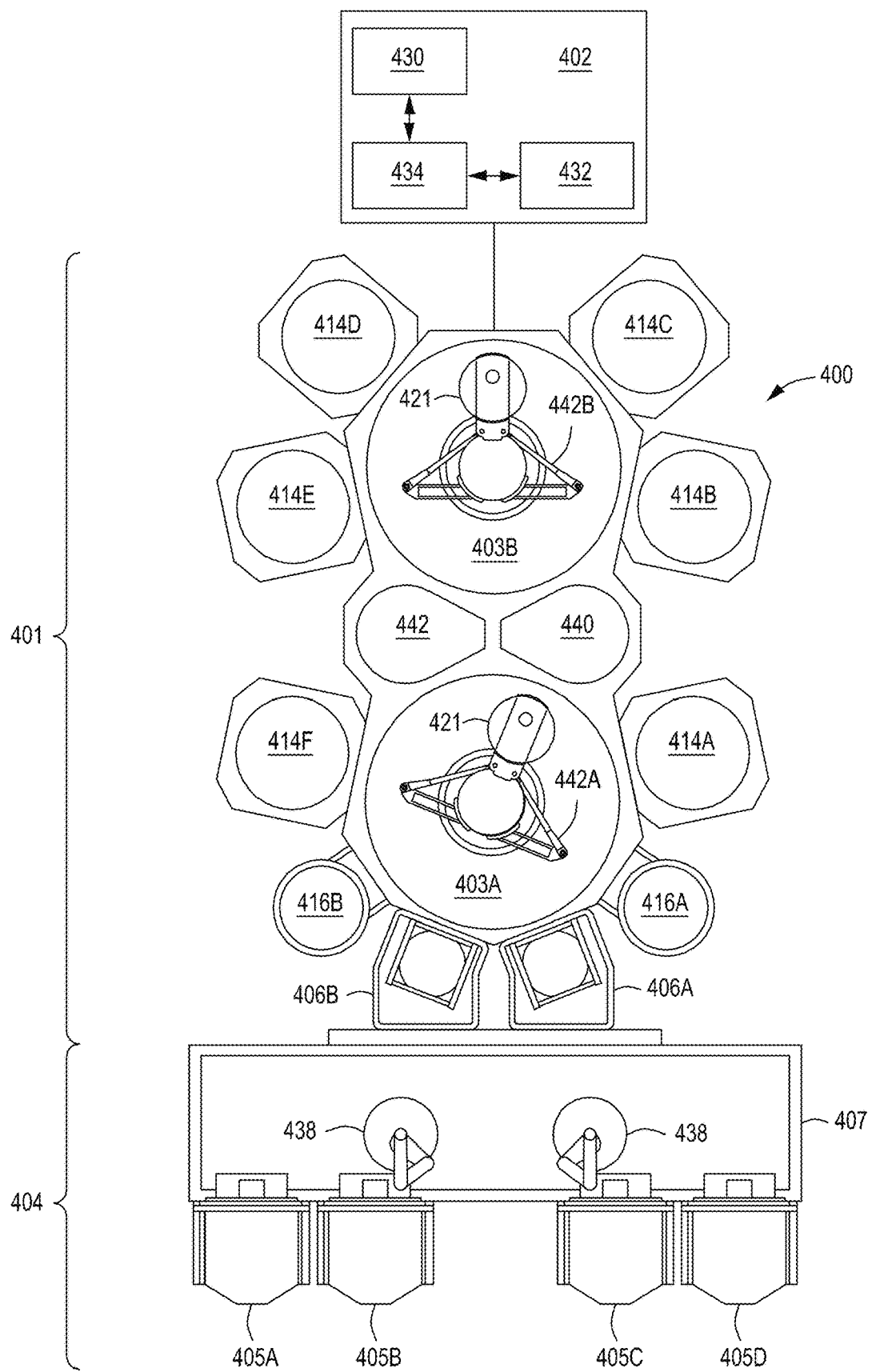
FIG. 4 depicts a top-down view of a cluster tool in accordance with some embodiments of the present principles.

The example of the lamp assembly 102 may be further extended by being placed in-situ in a process chamber, such as, for example but not limited to, process chamber 414E that is part of an integrated tool 400 described below with respect to FIG. 4. In such an environment, the background vibrations may become significant (much more so than in a standalone process chamber). In some embodiments, the vibration analyzer 206 may take several background vibration readings via the accelerometers 204 over a given amount of time or process intervals to average the background vibrations. In some embodiments, the vibration analyzer 206 may take background vibration readings at specific points in a process flow used by the integrated tool 400. Vibration testing pulses initiated by the vibration analyzer 206 can then be initiated at the same specific point or points in the process flow to allow for a more accurate removal of the background vibrations.

The advantage of using an integrated tool 400 is that there is no vacuum break between chambers and, therefore, no requirement to degas and pre-clean a substrate before treatment or deposition in a chamber. The integrated tool 400 includes a vacuum-tight processing platform 401, a factory interface 404, and a system controller 402. The processing platform 401 comprises multiple processing chambers, such as 414A, 413B, 414C, 414D, 414E, and 414F operatively coupled to a vacuum substrate transfer chamber (transfer chambers 403A, 403B). The factory interface 404 is operatively coupled to the transfer chamber 403A by one or more load lock chambers (two load lock chambers, such as 406A and 406B shown in FIG. 4).

In some embodiments, the factory interface 404 comprises at least one docking station 407, at least one factory interface robot 438 to facilitate the transfer of the semiconductor substrates. The docking station 407 is configured to accept one or more front opening unified pod (FOUP). Four FOUPS, such as 405A, 405B, 405C, and 405D are shown in the embodiment of FIG. 4. The factory interface robot 438 is configured to transfer the substrates from the factory interface 404 to the processing platform 401 through the load lock chambers, such as 406A and 406B. Each of the load lock chambers 406A and 406B have a first port coupled to the factory interface 404 and a second port coupled to the transfer chamber 403A.

The load lock chamber 406A and 406B are coupled to a pressure control system (not shown) which pumps down and vents the load lock chambers 406A and 406B to facilitate passing the substrates between the vacuum environment of the transfer chamber 403A and the substantially ambient (e.g., atmospheric) environment of the factory interface 404. The transfer chambers 403A, 403B have vacuum robots 442A, 442B disposed in the respective transfer chambers 403A, 403B. The vacuum robot 442A is capable of transferring substrates 421 between the load lock chamber 406A, 406B, the processing chambers 414A and 414F and a cooldown station 440 or a pre-clean station 442. The vacuum robot 442B is capable of transferring substrates 421 between the cooldown station 440 or pre-clean station 442 and the processing chambers 414B, 414C, 414D, and 414E.

In some embodiments, the processing chambers 414A, 414B, 414C, 414D, 414E, and 414F are coupled to the transfer chambers 403A, 403B. The processing chambers 414A, 414B, 414C, 414D, 414E, and 414F may comprise, for example, annealing chambers, preclean chambers, ALD process chambers, PVD process chambers, remote plasma chambers, CVD chambers, or the like. In some embodiments, one or more optional service chambers (shown as 416A and 416B) may be coupled to the transfer chamber 403A. The service chambers 416A and 416B may be configured to perform other substrate processes, such as degassing and argon treatments, and the like.

The system controller 402 controls the operation of the tool 400 using a direct control of the process chambers 414A, 414B, 414C, 414D, 414E, and 414F or alternatively, by controlling the computers (or controllers) associated with the process chambers 414A, 414B, 414C, 414D, 414E, and 414F and the tool 400. In operation, the system controller 402 enables data collection and feedback from the respective chambers and systems to optimize performance of the tool 400. The system controller 402 generally includes a Central Processing Unit (CPU) 430, a memory 434, and a support circuit 432. The CPU 430 may be any form of a general-purpose computer processor that can be used in an industrial setting. The support circuit 432 is conventionally coupled to the CPU 430 and may comprise a cache, clock circuits, input/output subsystems, power supplies, and the like. Software routines, such as the methods described herein may be stored in the memory 434 and, when executed by the CPU 430, transform the CPU 430 into a specific purpose computer (system controller) 402. The software routines may also be stored and/or executed by a second controller (not shown) that is located remotely from the tool 400.

Figure 5:
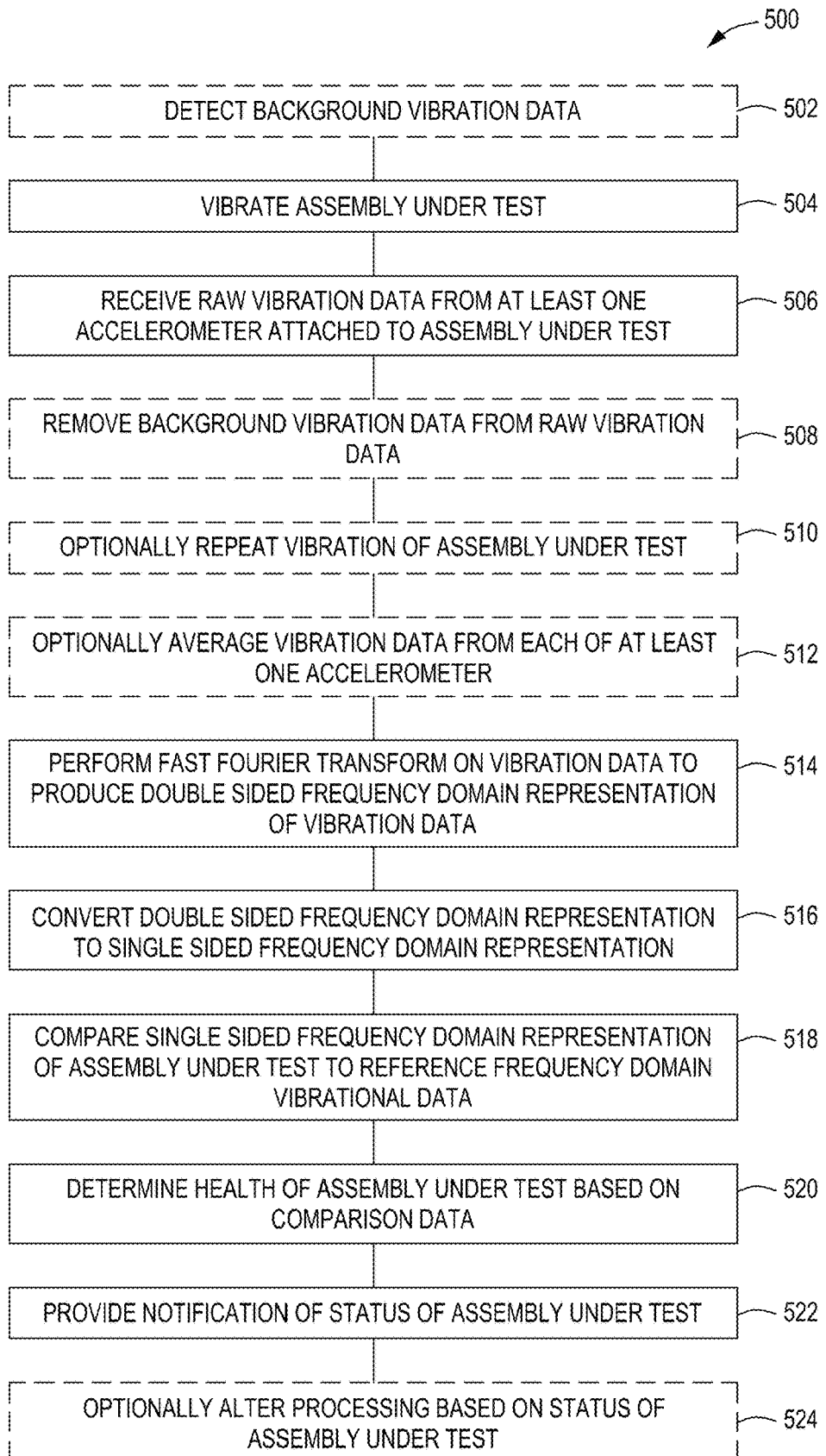
FIG. 5 is a method of determining a health status of a semiconductor process chamber assembly in accordance with some embodiments of the present principles.

A method 500 of determining an operational status of a semiconductor manufacturing assembly in accordance with some embodiments is depicted in FIG. 5. In optional block 502, in some embodiments, especially where a process chamber is exposed to significant amounts of background vibration noise, one or more accelerometers associated with an in-situ assembly (assembly under test) are used to gather background vibration data on the background noise prior to or after conducting a vibration test of the in-situ assembly. In block 504, a vibration pulse is generated within the in-situ assembly. In some embodiments, the vibration pulse may be initiated by a vibration generator attached to the in-situ assembly. The vibration pulse may also be initiated automatically at various time intervals or after a given number of substrates have been processed and the like. The vibration pulse may also be automatically initiated when a predicted lifespan of the in-situ assembly has been previously predicted by performance data and/or maintenance data to determine the operational status of the in-situ assembly.

Figure 6:
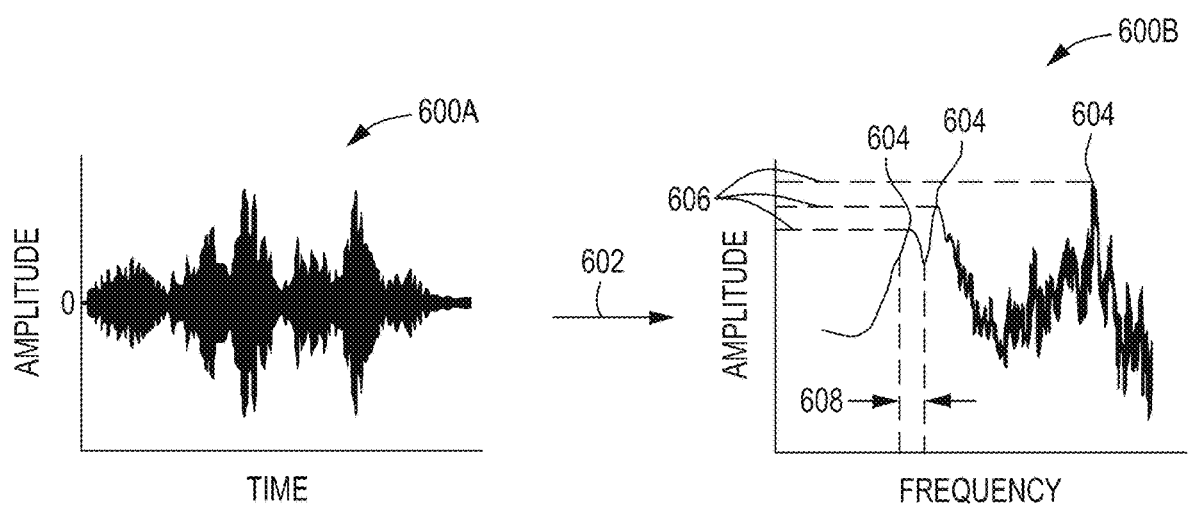
FIG. 6 depicts graphs of vibration data in accordance with some embodiments of the present principles.

In block 506, vibration data from the vibration pulse traveling through the internal structure of the in-situ assembly is received by at least one accelerometer attached to the in-situ assembly. In some embodiments, the accelerometer may be a 9-axis accelerometer or the like. In some embodiments, multiple accelerometers are placed symmetrically around the in-situ assembly or placed near locations where prominent defects are likely to form. In some embodiments, a vibration analyzer may be used receive the vibration data from the accelerometers. Vibration data received from an accelerometer may be used to produce a graph such as graph 600A as depicted in FIG. 6. The graph 600A depicts the vibration data's amplitude over time. In optional block 508, in some embodiments where background vibration data is obtained, the background vibration data is removed from the vibration data obtained by the accelerometers after a test vibration pulse is initiated to more accurately represent the actual test vibration data.

In optional block 510, in some embodiments, the in-situ assembly may be tested multiple times by sending a vibration pulse and receiving data from the accelerometers multiple times. In optional block 512, the vibration data received during each test may be averaged with the other test data to produce a more accurate set of vibration data for analysis. In block 514, the vibration data is transformed using an FFT process to produce a double-sided frequency domain representation of the vibration data. In block 516, the double-sided frequency domain representation of the vibration data is converted into a single-sided frequency domain representation. The processing of the vibration data is represented in FIG. 6 by the arrow 602 to produce a graph 600B of vibration data in a single-sided frequency domain for analysis. The location (frequency) of the peaks 604, the amplitude of the peaks 606, and/or the widths 608 (frequency spread of the peak) of the peaks may be used to determine an operational (health) status of the in-situ assembly.

In block 518, graphs produced by the vibration data after testing are compared to graphs of reference vibration data. In some embodiments, the reference vibration data may come from testing of the in-situ assembly when the assembly is first installed without any processing time on the assembly (e.g., a known good assembly without any defects, etc.). The reference vibration data may also be produced based on ex-situ data that is extrapolated to known process chamber environments (affects of the process chamber on the vibration data of an ex-situ tested assembly is previously known, etc.). In block 520, the health or operational status of the in-situ assembly is determined based on the comparison data between the reference graph data and the test graph data of the in-situ assembly. For example, peak location shifting, peak width changes, and/or peak amplitude changes may be noted between the graphs which may indicate a particular defect and/or may also indicate the severity of a particular defect based on historical data or predicted data.

The comparison data can yield health or operational status data not only of the type of defect but, for example, how many runtime hours or number of substrates before failure of the in-situ assembly.

In block 522, a status notification and/or an operational status report and the like can be provided. In some embodiments, the information is provided to an operator such as, but not limited to, a display associated with the process chamber and/or an audible signal or warning to alert an operator and the like. In some embodiments, the status notification can include a corrective action. For example, in some embodiments, the operational status information can be passed to a system controller and the like to enable the system controller to react accordingly by implementing a corrective action. In optional block 524, the notification status (e.g., go, no go, etc.) and/or the operational status (95% of life used, 5% of life remaining, etc.) can be used to alter the processing of the process chamber in which the in-situ assembly is installed. For example, a system controller may halt the process based on a 'no go' status or if life remaining is less than 1% and the like. In some embodiments, the system controller can alter the process to further extend the life of the in-situ assembly such as when the assembly is a heating unit, the temperature level could be brought up to temperature more slowly to allow for longer life expectancy (and still meet process requirements but possibly at a reduced throughput due to the slower temperature rise, etc.).

The method 500 can be utilized for in-situ assemblies composed of metals, ceramics, and/or quartz and the like. For example, ceramics have higher frequency peaks due to higher densities when new. Overtime, the ceramics may have lesser density causing peaks at lower frequencies (peak location shift) compared to new. Quartz containing defects such as inclusions and other imperfections will also have different FFT graphs than quartz assemblies without defects. Metals exhibiting oxidation and/or changes in shape will also exhibit different FFT graphs than metals without defects.

Figure 8:
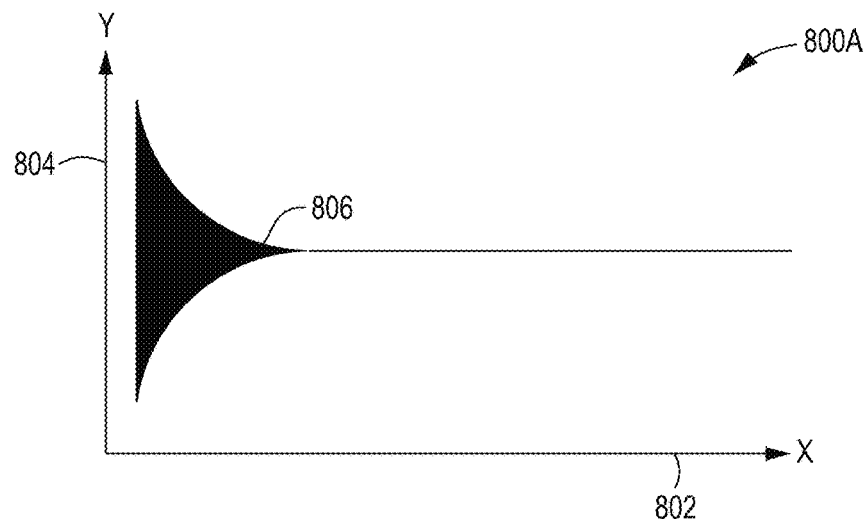
FIG. 8 depicts example processing of vibration data obtained from an assembly under test in accordance with some embodiments of the present principles.
Figure 8:
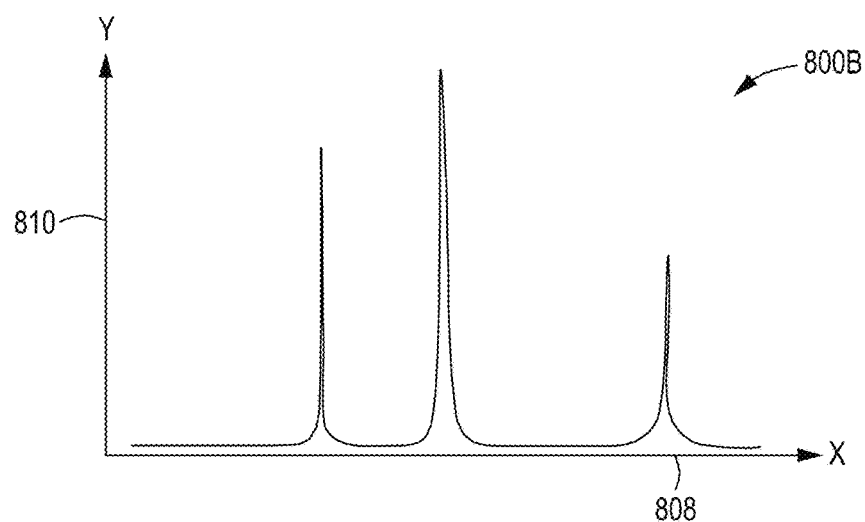
Figure 8:
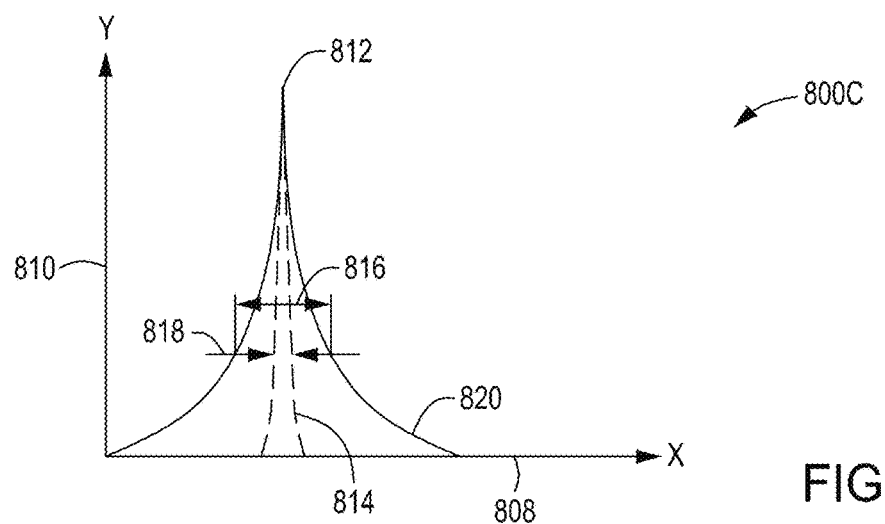

FIG. 8 depicts example processing of raw vibration data 806 obtained from an assembly under test in accordance with some embodiments. A raw vibration data graph 800A has an X-axis 802 in a time domain and a Y-axis 804 in a magnitude of g forces. The raw vibration data, in response to a vibration pulse initiated on the assembly under test, is obtained by an accelerometer which is then transmitted to a vibration analyzer. The raw vibration data is processed to convert from a time domain to a frequency domain through a discrete Fourier transfer (FFT) such as by using Eq. 1 below:

$$X(k) = \sum_{n=0}^{N-1} x(n)e^{-j\omega_k n} \quad \text{(Eq. 1)}$$

$$k = 0, 1, \ldots, N-1$$

The frequency domain data is then converted from a two-sided data set to a single-sided data set and then the amplitude is converted to decibels such as by using Eq. 2 below:

$$dB = 20\log_{10}\frac{a}{a_{ref}}; a_{ref} = 10^{-6}g \quad \text{(Eq. 2)}$$

Figure 9:
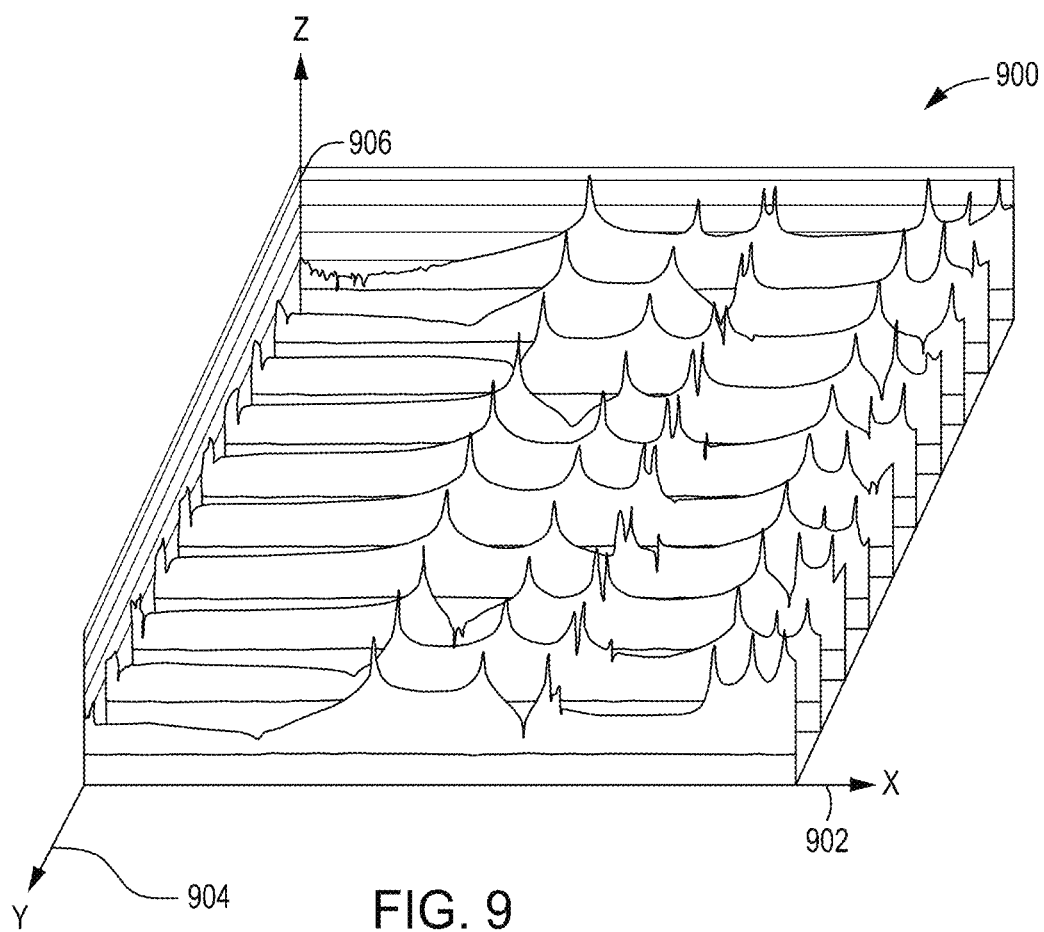
FIG. 9 depicts an example waterfall plot that may be used for analysis of the assembly under test in accordance with some embodiments of the present principles.

The data is plotted in a frequency domain graph 800B with an X-axis 808 in frequency versus a Y-axis 810 in decibels. The peaks can then be analyzed and compared to spectra between samples. A particular peak 812 as depicted in a zoomed view 800C of FIG. 8 can be analyzed against reference data (i.e., known good specimen of the assembly under test, etc.). For example, test data 820 may be compared against good clean assembly data 814 at a given point to compare a first width 818 of the good clean assembly data 814 to a second width 816 of the test data 820 for the particular peak 812. In some embodiments, a waterfall plot 900 may be used for analysis of the assembly under test in accordance with some embodiments as depicted in FIG. 9. The X-axis 902 denotes frequency, the Y-axis 904 denotes time, and the Z-axis 906 denotes g force in magnitude in a logarithmic scale. The waterfall plot 900 can be monitored in real time for changes in peak parameters (e.g., peak location shift over time, peak width changes over time, etc.), which can then be used for notification and/or to alter a current process, etc. based on the health/operational status of the assembly represented by the waterfall plot 900.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method of determining an operational status of a semiconductor manufacturing assembly, comprising:
   initiating, with a vibration generator, a first test vibration in an internal structure of the semiconductor manufacturing assembly while the semiconductor manufacturing assembly is in-situ in a semiconductor processing chamber;
   receiving a first vibration signal caused by the first test vibration;
   transforming the first vibration signal into a first frequency domain representation of the first vibration signal;
   determining the operational status of the semiconductor manufacturing assembly based on the first frequency domain representation; and
   performing a corrective action for the semiconductor manufacturing assembly in response to the operational status.

2. The method of claim 1, further comprising:
   using a plurality of accelerometers spaced symmetrically about a surface of the semiconductor manufacturing assembly to receive at least one vibration signal.

3. The method of claim 2, further including:
   averaging vibration signals obtained by each of the plurality of accelerometers before transforming vibration signals into frequency domain representations.

4. The method of claim 1, further comprising:
   automatically initiating the first test vibration based on a time interval or based on a number of substrates processed in the semiconductor processing chamber.

5. A method of determining an operational status of a semiconductor manufacturing assembly, comprising:
   initiating a first test vibration in an internal structure of the semiconductor manufacturing assembly while the semiconductor manufacturing assembly is in-situ in a semiconductor processing chamber;
   receiving a first vibration signal caused by the first test vibration;
   transforming the first vibration signal into a first frequency domain representation of the first vibration signal;
   determining the operational status of the semiconductor manufacturing assembly based on the first frequency domain representation;
   performing a corrective action for the semiconductor manufacturing assembly in response to the operational status;
   detecting a background vibration signal prior to initiating the first test vibration; and
   removing the background vibration signal from the first vibration signal prior to transforming the first vibration signal into the first frequency domain representation.

6. The method of claim 1, further comprising:
   providing a notification of the operational status as the corrective action to a controller for the semiconductor processing chamber; and
   automatically determining, by the controller, whether to proceed with processing substrates or to stop processing substrates.

7. The method of claim 1, further comprising:
   initiating a second test vibration in the internal structure of the semiconductor manufacturing assembly at an interval after the first test vibration;
   receiving a second vibration signal caused by the second test vibration;
   transforming the second vibration signal into a second frequency domain representation of the second vibration signal;
   comparing a first set of peaks of the first frequency domain representation of the first vibration signal to a second set of peaks of the second frequency domain representation of the second vibration signal; and
   determining the operational status of the semiconductor manufacturing assembly based on a comparison of the first set of peaks and the second set of peaks.

8. The method of claim 7, wherein the interval is based on a length of time or wherein the interval is based on a number of substrates processed by the semiconductor processing chamber.

9. The method of claim 7, further comprising:
   comparing peak location, peak magnitude, and peak width of the first set of peaks and the second set of peaks to, at least in part, determine the operational status of the semiconductor manufacturing assembly.

10. A method of determining an operational status of a semiconductor manufacturing assembly, comprising:
    initiating a first test vibration in an internal structure of the semiconductor manufacturing assembly while the semiconductor manufacturing assembly is in-situ in a semiconductor processing chamber;
    receiving a first vibration signal caused by the first test vibration;

transforming the first vibration signal into a first frequency domain representation of the first vibration signal;
initiating a second test vibration in the internal structure of the semiconductor manufacturing assembly at an interval after the first test vibration;
receiving a second vibration signal caused by the second test vibration;
transforming the second vibration signal into a second frequency domain representation of the second vibration signal;
converting the first frequency domain representation from a double-sided representation to a single-sided representation of the first vibration signal; and
converting the second frequency domain representation from a double-sided representation to a single-sided representation of the second vibration signal prior to comparing the first frequency domain representation of the first vibration signal to the second frequency domain representation of the second vibration signal;
comparing a first set of peaks of the first frequency domain representation of the first vibration signal to a second set of peaks of the second frequency domain representation of the second vibration signal;
determining the operational status of the semiconductor manufacturing assembly based on a comparison of the first set of peaks and the second set of peaks; and
performing a corrective action for the semiconductor manufacturing assembly in response to the operational status.

11. A method of determining an operational status of a semiconductor manufacturing assembly, comprising:
detecting a background vibration signal while the semiconductor manufacturing assembly is in-situ in a semiconductor processing chamber;
initiating a first test vibration in an internal structure of the semiconductor manufacturing assembly;
receiving a first vibration signal caused by the first test vibration;
removing the background vibration signal from the first vibration signal to obtain a first filtered vibration signal;
transforming the first filtered vibration signal to obtain a first frequency domain representation of the first filtered vibration signal;
initiating a second test vibration at an interval after the first test vibration in the internal structure of the semiconductor manufacturing assembly while the semiconductor manufacturing assembly is in-situ in the semiconductor processing chamber;
receiving a second vibration signal caused by the second test vibration;
removing the background vibration signal from the second vibration signal to obtain a second filtered vibration signal;
transforming the second filtered vibration signal to obtain a second frequency domain representation of the second vibration signal;
comparing a first set of peaks of the first frequency domain representation of the first filtered vibration signal to a second set of peaks of the second frequency domain representation of the second filtered vibration signal obtained from the semiconductor manufacturing assembly to determine the operational status of the semiconductor manufacturing assembly, wherein comparing includes comparing peak location, peak magnitude, and peak width of the first set of peaks and the second set of peaks; and
performing a corrective action for the semiconductor manufacturing assembly in response to the operational status.

12. The method of claim 11, wherein the interval is based on a length of time or wherein the interval is based on a number of substrates processed by the semiconductor processing chamber.

13. The method of claim 11, further comprising:
using a plurality of accelerometers spaced symmetrically about a surface of the semiconductor manufacturing assembly to receive vibration signals.

14. The method of claim 13, further including:
averaging vibration signals obtained by each of the plurality of accelerometers prior to transforming vibration signals into frequency domain representations.

15. The method of claim 11, wherein the first test vibration and the second test vibration occur automatically.

16. The method of claim 15, further comprising:
automatically initiating the first test vibration or the second test vibration based on a time interval or based on a number of substrates processed in the semiconductor processing chamber.

17. The method of claim 11, further comprising:
converting the first frequency domain representation from a double-sided representation to a single-sided representation of the first vibration signal; and
converting the second frequency domain representation from a double-sided representation to a single-sided representation of the second vibration signal prior to comparing the first frequency domain representation of the first vibration signal to the second frequency domain representation of the second vibration signal.

18. The method of claim 11, further comprising:
providing a notification of the operational status to a controller for the semiconductor processing chamber; and
automatically determining, by the controller, whether to proceed with processing substrates or to stop processing substrates as the corrective action.

19. A non-transitory, computer readable medium having instructions stored thereon that, when executed, cause a method of determining an operational status of a semiconductor manufacturing assembly to be performed, the method comprising:
initiating, with a vibration generator, a first test vibration in an internal structure of the semiconductor manufacturing assembly while the semiconductor manufacturing assembly is in-situ in a semiconductor processing chamber;
receiving a first vibration signal caused by the first test vibration;
transforming the first vibration signal into a first frequency domain representation of the first vibration signal;
determining the operational status of the semiconductor manufacturing assembly based on the first frequency domain representation; and
performing a corrective action for the semiconductor manufacturing assembly in response to the operational status.

20. The non-transitory, computer readable medium of claim 19, further comprising at least one of a, b, c, or d:
(a) determining the operational status using peak location, peak magnitude, and peak width of peaks in the first frequency domain representation; or
(b) detecting a background vibration signal prior to initiating the first test vibration;

removing the background vibration signal from the first vibration signal prior to transforming the first vibration signal into the first frequency domain representation; or
(c) converting the first frequency domain representation from a double-sided (c) representation to a single-sided representation of the first vibration signal; or
(d) providing a notification of the operational status to a controller for the semiconductor processing chamber; and automatically determining, by the controller, whether to proceed with processing substrates or to stop processing substrates as the corrective action.

\* \* \* \* \*